(12) United States Patent
Chen et al.

(10) Patent No.: US 10,980,144 B2
(45) Date of Patent: Apr. 13, 2021

(54) SUPPORT ASSEMBLY FOR SUPPORTING A CABLE AND ADAPTED TO A RACK SYSTEM

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chih-Hsin Yeh, Kaohsiung (TW); Chun-Chiang Wang, Kaohsiung (TW)

(73) Assignees: KING SLIDE WORKS CO., LTD., Kaohsiung (TW); KING SLIDE TECHNOLOGY CO., LTD., Kaohsiung (TW)

( * ) Notice: Subject to any disclaimer, the term of this patent is extended or adjusted under 35 U.S.C. 154(b) by 0 days.

(21) Appl. No.: 16/197,300

(22) Filed: Nov. 20, 2018

(65) Prior Publication Data
US 2020/0037462 A1    Jan. 30, 2020

(30) Foreign Application Priority Data
Jul. 27, 2018    (TW) .................................. 107126411

(51) Int. Cl.
*H05K 7/14* (2006.01)
*H02G 3/04* (2006.01)
*H02G 3/32* (2006.01)

(52) U.S. Cl.
CPC ......... *H05K 7/1491* (2013.01); *H02G 3/0456* (2013.01); *H02G 3/32* (2013.01)

(58) Field of Classification Search
CPC .. H05K 7/1491; H05K 7/1488; H05K 7/1485; H02G 3/32; H02G 3/0456
See application file for complete search history.

(56) References Cited

U.S. PATENT DOCUMENTS

| 7,554,819 B2 * | 6/2009 | Chen .................... H05K 7/1491 |
| | | 361/727 |
| 7,712,615 B2 * | 5/2010 | Chen .................... H01R 9/2416 |
| | | 211/26 |

(Continued)

FOREIGN PATENT DOCUMENTS

| EP | 3076773 A1 * | 10/2016 | ........... H05K 7/1489 |
| EP | 3076774 A1 * | 10/2016 | ........... H05K 7/1491 |

(Continued)

*Primary Examiner* — Rockshana D Chowdhury
*Assistant Examiner* — Douglas R Burtner
(74) *Attorney, Agent, or Firm* — Winston Hsu

(57) ABSTRACT

A support assembly includes a first slide rail assembly, a second slide rail assembly, a first cable management device and a second cable management device. The first slide rail assembly includes a first rail and a second rail movable relative to the first rail. The second slide rail assembly includes a third rail and a fourth rail movable relative to the third rail. The first cable management device is mounted to the second rail of the first slide rail assembly and the fourth rail of the second slide rail assembly. The second cable management device includes a first cable management arm and a second cable management arm. The first cable management arm is mounted to the first rail of the first slide rail assembly and the second cable management arm is mounted to the second rail of the first slide rail assembly.

3 Claims, 9 Drawing Sheets

(56) References Cited

U.S. PATENT DOCUMENTS

| | | | | |
|---|---|---|---|---|
| 8,186,634 | B2* | 5/2012 | Chen | H02G 3/0456 |
| | | | | 248/70 |
| 8,231,014 | B2* | 7/2012 | Chen | H02G 3/0456 |
| | | | | 211/26 |
| 8,251,321 | B2* | 8/2012 | Chen | H05K 7/1491 |
| | | | | 248/70 |
| 9,144,174 | B2* | 9/2015 | Chen | H05K 7/1421 |
| 10,182,511 | B1* | 1/2019 | Chen | H05K 7/18 |
| 2005/0145582 | A1* | 7/2005 | Dubon | H02G 11/00 |
| | | | | 211/26 |
| 2009/0014601 | A1* | 1/2009 | Chen | H05K 7/1491 |
| | | | | 248/70 |
| 2015/0342081 | A1* | 11/2015 | Chang | H05K 7/1491 |
| | | | | 361/679.02 |
| 2016/0186895 | A1* | 6/2016 | Chen | H02B 1/012 |
| | | | | 248/68.1 |
| 2016/0286683 | A1* | 9/2016 | Chen | A47B 88/493 |
| 2016/0330859 | A1* | 11/2016 | Chen | F16L 3/015 |
| 2018/0054911 | A1* | 2/2018 | Chen | H05K 7/1491 |
| 2019/0391354 | A1* | 12/2019 | Sedor | H05K 7/1491 |

FOREIGN PATENT DOCUMENTS

| | | |
|---|---|---|
| GB | 2 420 964 A | 6/2006 |
| JP | 2018-26523 A | 2/2018 |

* cited by examiner

SUPPORT ASSEMBLY FOR SUPPORTING A CABLE AND ADAPTED TO A RACK SYSTEM

BACKGROUND OF THE INVENTION

1. Field of the Invention

The present invention relates to a support assembly, and more particularly, to a support assembly comprising two cable management devices.

2. Description of the Prior Art

Slide rail assemblies have a wide range of applications, such as in furniture drawers or rack systems. Within such rack systems, a slide rail assembly is commonly used to carry an object (such as an electronic apparatus). The carried object typically contains cables that require a cable management device to support. Wherein, the cable management device typically has two movable cable management arms that can be connected to two slide rails of the aforementioned slide rail assembly.

A support slide assembly (1) for a cable management arm, as described in U.S. Pat. No. 7,712,615 B2, can be used with a first slide assembly (30A) and a second slide assembly (30B). The support slide assembly (1) includes a first rod (11) and a second rod (12) slidably connected to the first rod (11), and the support slide assembly (1) can be used to support a cable management arm (2). When the slide rails (312, 313) of the two aforementioned slide assemblies (30A, 30B) move toward an opening direction relative to the first rail (311), the two cable management arms (2) will be extended from a retracted status.

However, as market demands change, it may not be sufficient to support parts of the cables of a carried object using cable management arms (2). In other words, other parts of the cables of the aforementioned carried object may not be sufficiently supported. Therefore, the development of a novel product to satisfy such particular market demands has become an important topic.

SUMMARY OF THE INVENTION

The present invention relates to a support assembly comprising two cable management devices.

According to an aspect of the present invention, a support assembly comprises a first slide rail assembly, a second slide rail assembly, a first cable management device, and a second cable management device. The first slide rail assembly comprises a first rail and a second rail movable relative to the first rail; the second slide rail assembly comprises a third rail and a fourth rail movable relative to the third rail; the first cable management device is mounted to the second rail of the first slide rail assembly and the fourth rail of the second slide rail assembly; the second cable management device comprises a first cable management arm and a second cable management arm, wherein the first cable management arm is mounted to the first rail of the first slide rail assembly, and the second cable management arm is mounted to the second rail of the first slide rail assembly.

Preferably, one end of the first cable management arm is pivotally connected to one end of the second cable management arm. Another end of the first cable management arm is detachably mounted to the first rail of the first slide rail assembly, whereas another end of the second cable management arm is detachably mounted to the second rail of the first slide rail assembly.

Preferably, the first slide rail assembly further comprises a first middle rail movably connecting the first rail and the second rail, so as to extend a movement range of the second rail relative to the first rail. The second slide rail assembly further comprises a second middle rail moveably connecting the third rail and the fourth rail, so as to extend a movement range of the fourth rail relative to the third rail.

Preferably, the second cable management device further comprises at least one support bar, the at least one support bar is configured to support one of the first cable management arm and the second cable management arm.

Preferably, one of two ends of the at least one support bar is mounted to the first middle rail of the first slide rail assembly, and the other one of the two ends of the at least one support bar is mounted to a channel of the third rail of the second slide rail assembly. Or, one of the two ends of the at least one support bar is mounted to the first middle rail of the first slide rail assembly, and the other one of the two ends of the at least one support bar is mounted to the second middle rail of the second slide rail assembly. Or, one of the two ends of the at least one support bar is mounted to the first middle rail of the first slide rail assembly, and the other one of the two ends of the at least one support bar is pivotally mounted to the third rail of the second slide rail assembly.

Preferably, the first cable management device comprises a first cross bar and a second cross bar movably connected to the first cross bar.

Preferably, the first cross bar is detachably mounted to the second rail of the first slide rail assembly, and the second cross bar is detachably mounted to the fourth rail of the second slide rail assembly.

Preferably, the second cross bar is connected to the first cross bar in an extendable and retractable manner.

According to another aspect of the present invention, a support assembly for a rack system comprises a first slide rail assembly, a second slide rail assembly, a carried object, a first cable management device, and a second cable management device. The first slide rail assembly is mounted to a first side of the rack system. The second slide rail assembly is mounted to a second side of the rack system. The carried object is mounted between the first slide rail assembly and the second slide rail assembly. The first cable management device is positioned between the carried object and the second cable management device, where it is used to manage a front cable section of the carried object. The second cable management device is configured to arrange a rear cable section of the carried object.

According to another aspect of the present invention, a cable management kit comprises a first cable management device and a second cable management device. The first cable management device comprises a first cross bar and a second cross bar movably connected to the first cross bar; the second cable management device comprises a first cable management arm, a second cable management arm, and at least one support bar; wherein the second cable management arm is pivotally connected to the first cable management arm, and the at least one support bar is configured to support one of the first cable management arm and the second cable management arm. The first cable management device is separate from the second cable management device.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
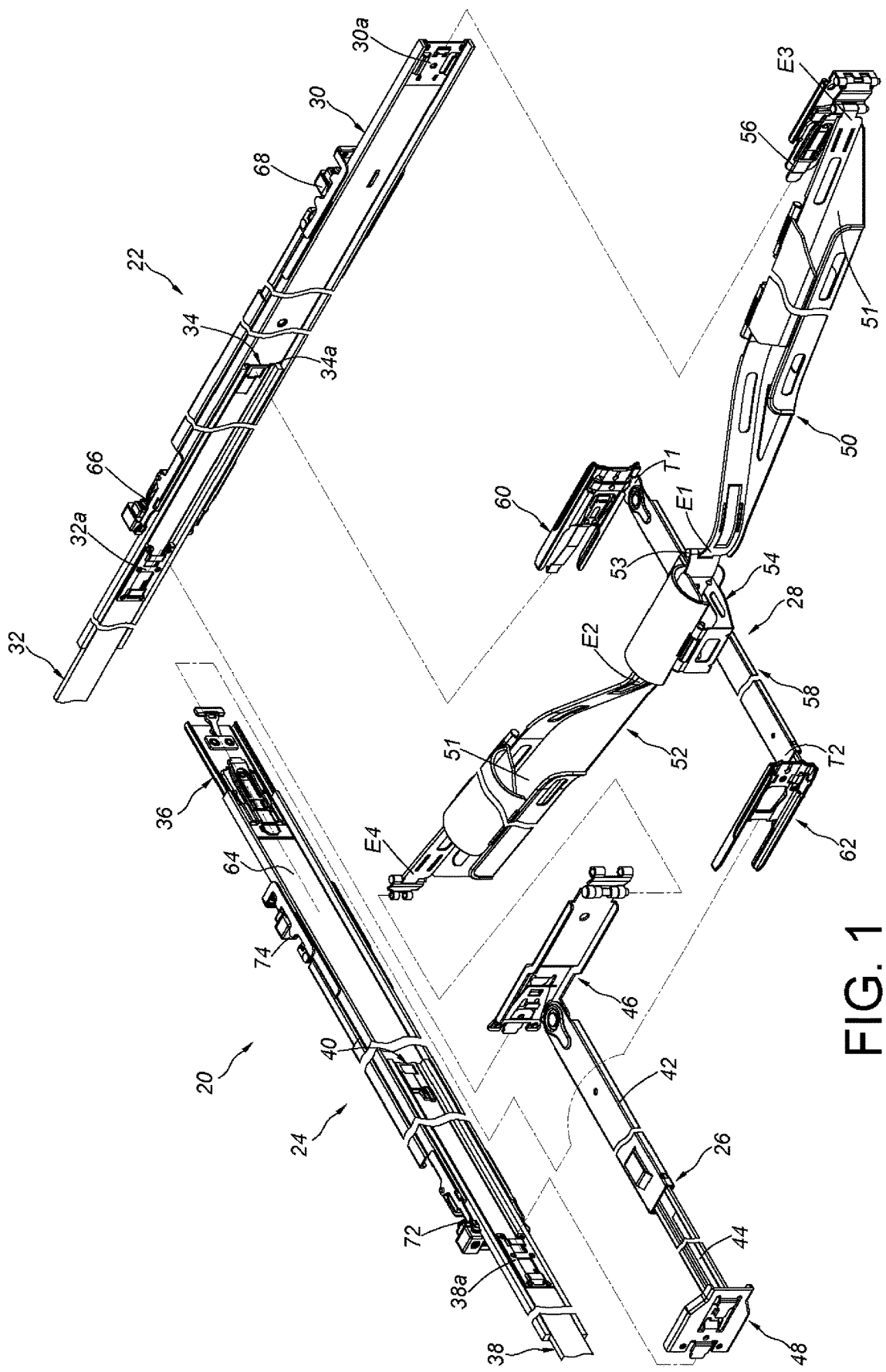
FIG. 1 is an exploded schematic diagram illustrating a support assembly according to a first embodiment of the present invention.
Figure 2:
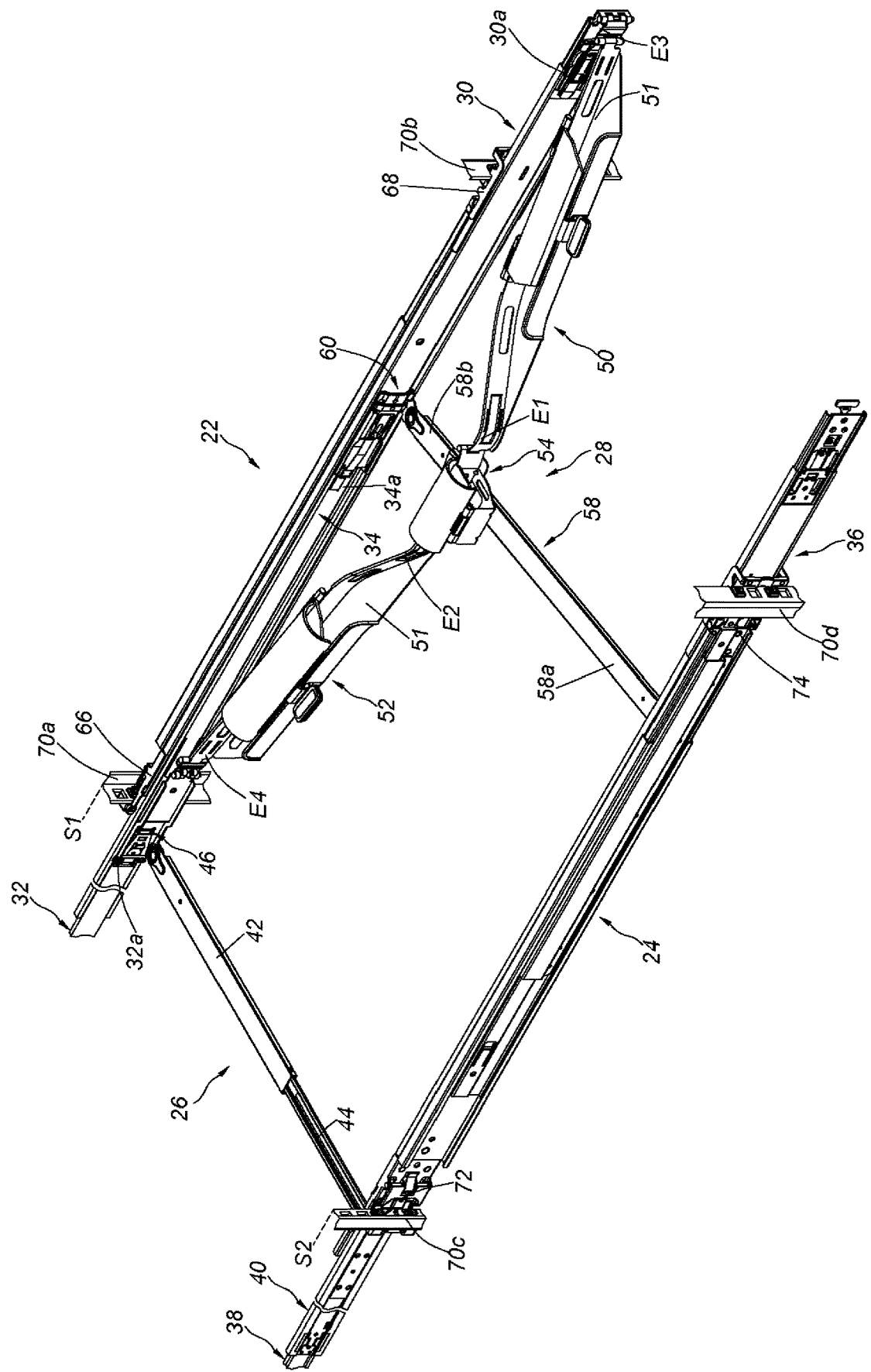
FIG. 2 is a schematic diagram illustrating the support assembly implemented on a rack system according to the first embodiment of the present invention.

As shown in FIGS. 1 and 2, a support assembly 20 of the first embodiment of the present invention comprises a first slide rail assembly 22, a second slide rail assembly 24, a first cable management device 26 and a second cable management device 28, wherein the first cable management device 26 and the second cable management device 28 comprise a cable management kit.

The first slide rail assembly 22 comprises a first rail 30 and a second rail 32, wherein the second rail 32 is movable in a longitudinal direction relative to the first rail 30. Preferably, the first slide rail assembly 22 further comprises a first middle rail 34 movably connecting the first rail 30 and the second rail 32, so as to extend a movement range of the second rail 32 relative to the first rail 30.

The second slide rail assembly 24 comprises a third rail 36 and a fourth rail 38, and the fourth rail 38 is movable in a longitudinal direction relative to the third rail 36. Preferably, the second slide rail assembly 24 further comprises a second middle rail 40 movably connecting the third rail 36 and the fourth rail 38, so as to extend a movement range of the fourth rail 38 relative to the third rail 36.

The first cable management device 26 is mounted to the second rail 32 of the first slide rail assembly 22 and the fourth rail 38 of the second slide rail assembly 24. Preferably, the first cable management device 26 comprises a first crossbar 42 and a second cross bar 44, and the second cross bar 44 is movably connected to the first cross bar 42. Preferably, the second cross bar 44 is connected to the first cross bar 42 in an extendable and retractable manner. For example, one of the first cross bar 42 and the second cross bar 44 has a channel for mounting the other one of the first cross bar 42 and the second cross bar 44, so that the first cross bar 42 and the second cross bar 44 can extend or retract relative to each other. Wherein, the first cross bar 42 is detachably mounted to the second rail 32 of the first slide rail assembly 22. Preferably, the first cross bar 42 is detachably mounted to the rear end 32a of the second rail 32 that is close to the first slide rail assembly 22, through a first connecting member 46 by insertion, snapping or latching, the manner of mounting in the present invention is not limited thereto. On the other hand, the second cross bar 44 is detachably mounted to the fourth rail 38 of the second slide rail assembly 24. Preferably, the second cross bar 44 is detachably mounted to the rear end 38a of the fourth rail 38 that is close to the second slide rail assembly 24 through a second connecting member 48 by insertion, snapping or latching, the manner of mounting in the present invention is not limited thereto.

The second cable management device 28 comprises a first cable management arm 50 and a second cable management arm 52. A cable management feature 51 is disposed on the first cable management arm 50 and the second cable management arm 52 to store or support cable (s). The aforementioned cable management feature 51 can be a containing slot or a containing box detachably disposed on the first cable management arm 50 and the second cable management arm 52, the present invention is not limited thereto. Furthermore, the first cable management arm 50 is mounted on the first rail 30 of the first slide rail assembly 22, and the second cable management arm 52 is mounted on the second rail 32 of the first slide rail assembly 22. Preferably, one end E1 of the first cable management arm 50 is pivotally connected to one end E2 of the second cable management arm 52. Herein, the aforementioned end E1 of the first cable management arm 50 is pivotally connected to the end E2 of the second cable management arm 52 through a pivoting base 54 using a shaft 53 (one of the shafts is not shown). Preferably, another end E3 of the first cable management arm 50 is pivotally connected to a third connecting member 56, and the end E3 is detachably mounted to the rear end 30a of the first rail 30 that is close to the first slide rail assembly 22 through the third connecting member 56 by insertion, snapping or latching, the manner of mounting in the present invention is not limited thereto. On the other hand, another end E4 of the second cable management arm 52 is pivotally connected to the first connecting member 46, and as mentioned previously, the first connecting member 46 is detachably mounted to the rear end 32a of the second rail 32 of the first slide rail assembly 22.

Preferably, the second cable management device 28 further comprises at least one support bar 58, the at least one support bar 58 is configured to support one of the first cable management arm 50 and the second cable management arm 52. Supporting the bottom of the first cable management arm 50 and the bottom of the second cable management arm 52 using the at least one support bar 58 through the pivoting base 54 is illustrative of an example hereinafter. Preferably, the at least one support bar 58 comprises two ends, e.g., a first end T1 and a second end T2, wherein the first end T1 is detachably mounted to the rear end 34a of the first middle rail 34 that is close to the first slide rail assembly 22 through a first mounting member 60 by insertion, snapping or latching, the manner of mounting in the present invention is not limited thereto. On the other hand, the second end T2 is arranged with a second mounting member 62, and the second mounting member 62 is movably mounted to a channel 64 of the third rail 36 of the second slide rail assembly 24 so as to be behind the second middle rail 40.

As shown in FIG. 2, the support assembly 20 is suitable for a rack system. The rack system comprises a rack, and the first slide rail assembly 22 is mounted to a first side S1 of the rack. On the other hand, the second slide rail assembly 24 is mounted to a second side S2 of the rack. Preferably, the first slide rail assembly 22 is mounted to a first post 70a and a second post 70b of the first side S1 of the rack via a first bracket 66 and a second bracket 68. On the other hand, the second slide rail assembly 24 is mounted to a third post 70c and a fourth post 70d of the second side S2 of the rack via a third bracket 72 and a fourth bracket 74.

Figure 3:
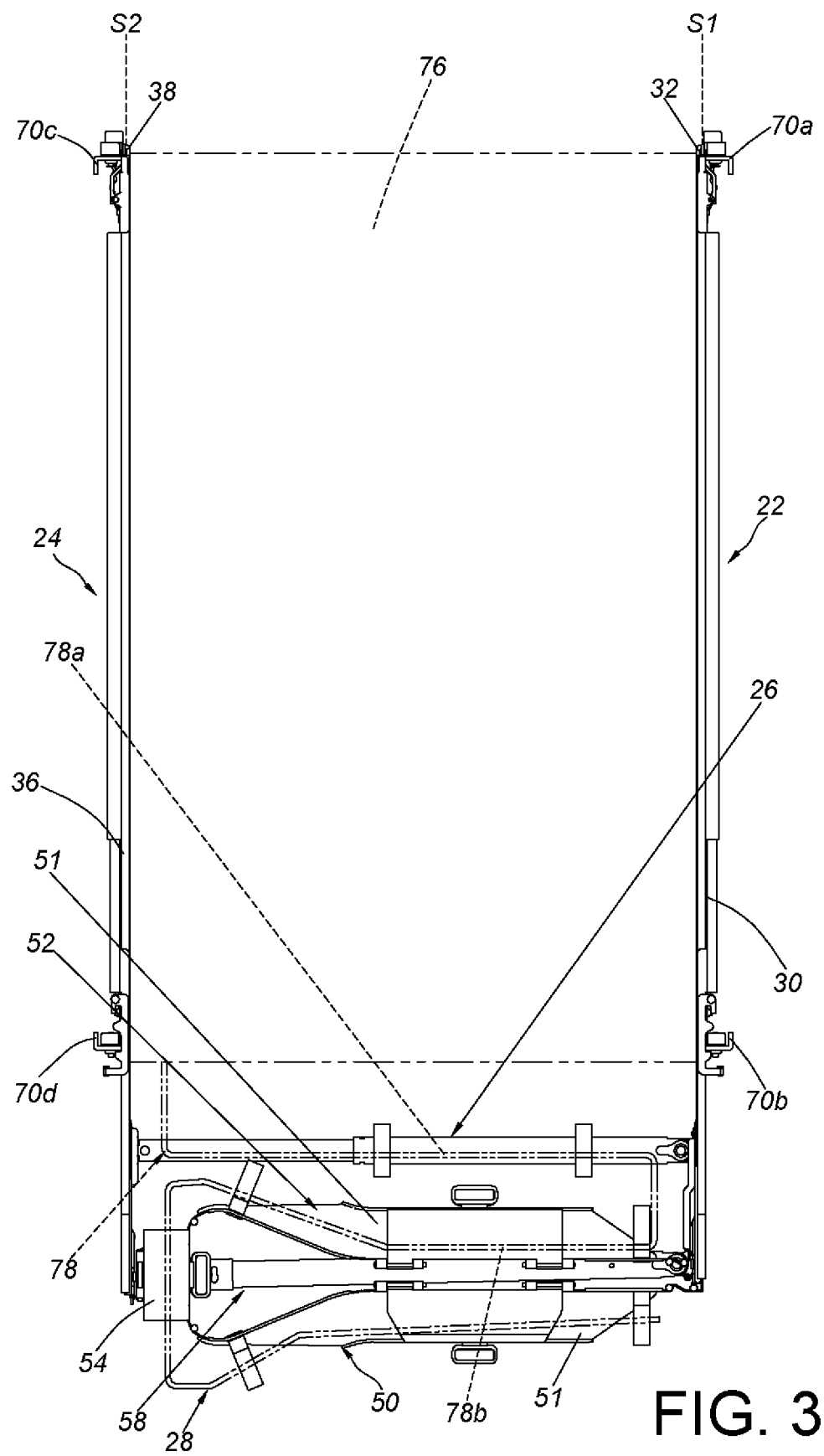
FIG. 3 is a schematic diagram illustrating the support assembly implemented on the rack system, and the support assembly being at a first predetermined status according to the first embodiment of the present invention.

As shown in FIG. 3, the first slide rail assembly 22 is mounted to the first side S1 of the rack, and the second slide rail assembly 24 is mounted to the second side S2 of the rack. Herein, a carried object 76 (such as an electronic apparatus or a chassis) is mounted between the first slide rail assembly 22 and the second slide rail assembly 24. The two sides of the carried object 76 being mounted to the second rail 32 of the first slide rail assembly 22 and the fourth rail 38 of the second slide rail assembly 24 is illustrative of an example hereinafter, but the present invention is not limited thereto. The first cable management device 26 is positioned between the carried object 76 and the second cable management device 28; e.g., the carried object 76 is in front of the first cable management device 26, and the second cable management device 28 is behind the first cable management device 26; wherein the first cable management device 26 is separate from the second cable management device 28. In other words, the first cable management device 26 and the second cable management device 28 are two independent cable support devices. That is, the first cable management device 26 is configured to arrange or support a front cable section 78a of cables 78 coming from the carried object 76, and the second cable management device 28 is configured to arrange or support a rear cable section 78b of cables coming from the carried object 76. Furthermore, the second rail 32 and the fourth rail 38 can be retracted relative to the first rail 30 and the third rail 36 respectively, such that the carried object 76 is at a retracted position inside the rack. On the other hand, the first cable management arm 50 and the second cable management arm 52 of the second cable management device 28 are at a retracted status relative to each other.

Figure 4:
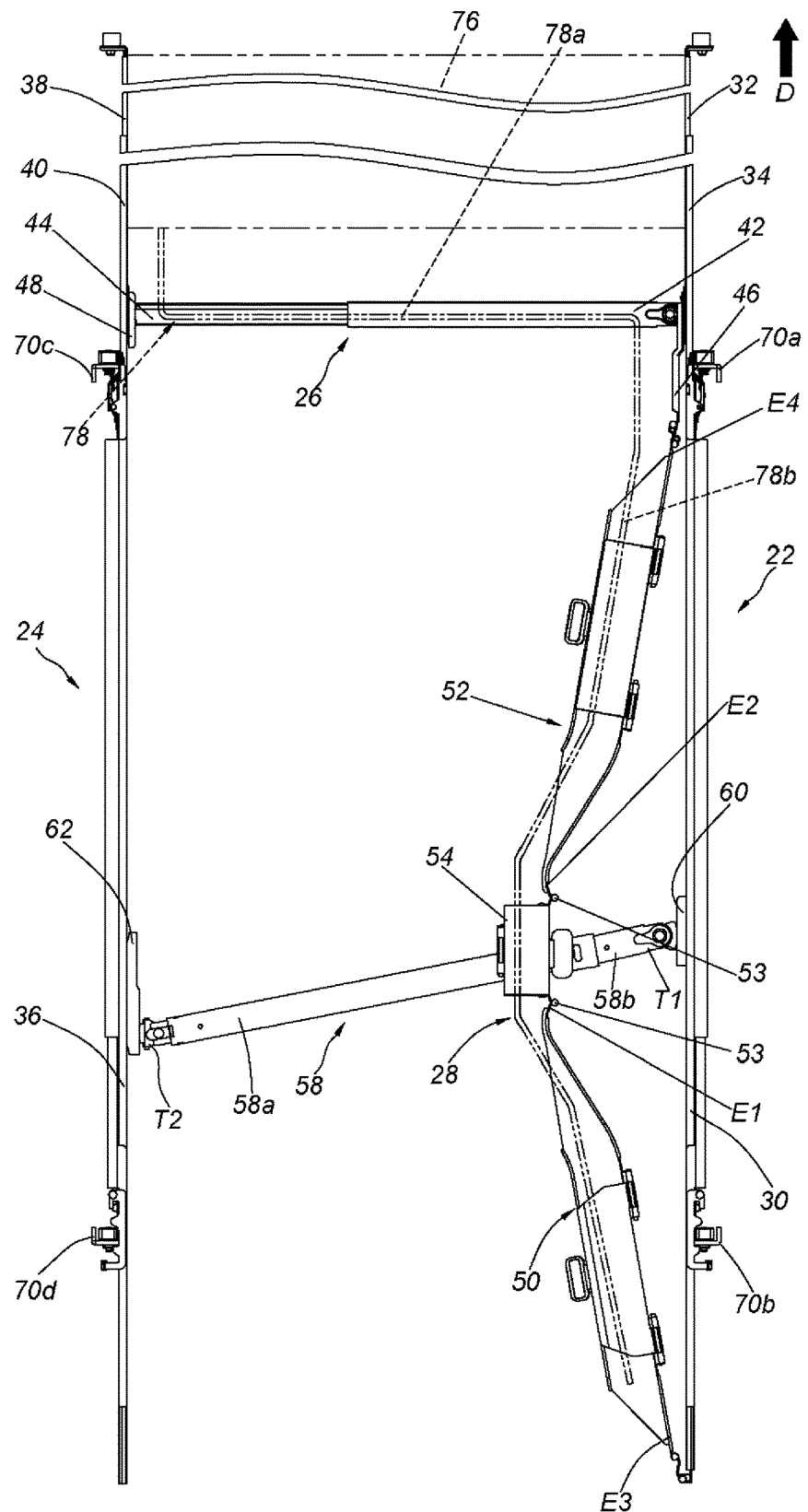
FIG. 4 is a schematic diagram illustrating the support assembly implemented on the rack system, and the support assembly being at a second predetermined status according to the first embodiment of the present invention.

As shown in FIG. 4, the second rail 32 and the fourth rail 38 can move toward an opening direction D relative to the first rail 30 and the third rail 36, respectively, such that the carried object 76 leaves the aforementioned retracted position and extend outside the rack; wherein the first cable management device 26 is led to move toward the opening direction D by the second rail 32 and the fourth rail 38. On the other hand, as a response to the second rail 32 moving toward the opening direction D, the second cable management arm 52 of the second cable management device 28 is led to move such that the second cable management arm 52 and the first cable management arm 50 become extended relative to each other. Preferably, the at least one support bar 58 comprises a first support bar 58a and a second support bar 58b. The second support bar 58b is movably connected (such as being connected in an extendable and retractable manner) to the first support bar 58a. Herein, the first end T1 is located on the second support bar 58b. On the other hand, the second end T2 is located on the first support bar 58a.

Figure 5:
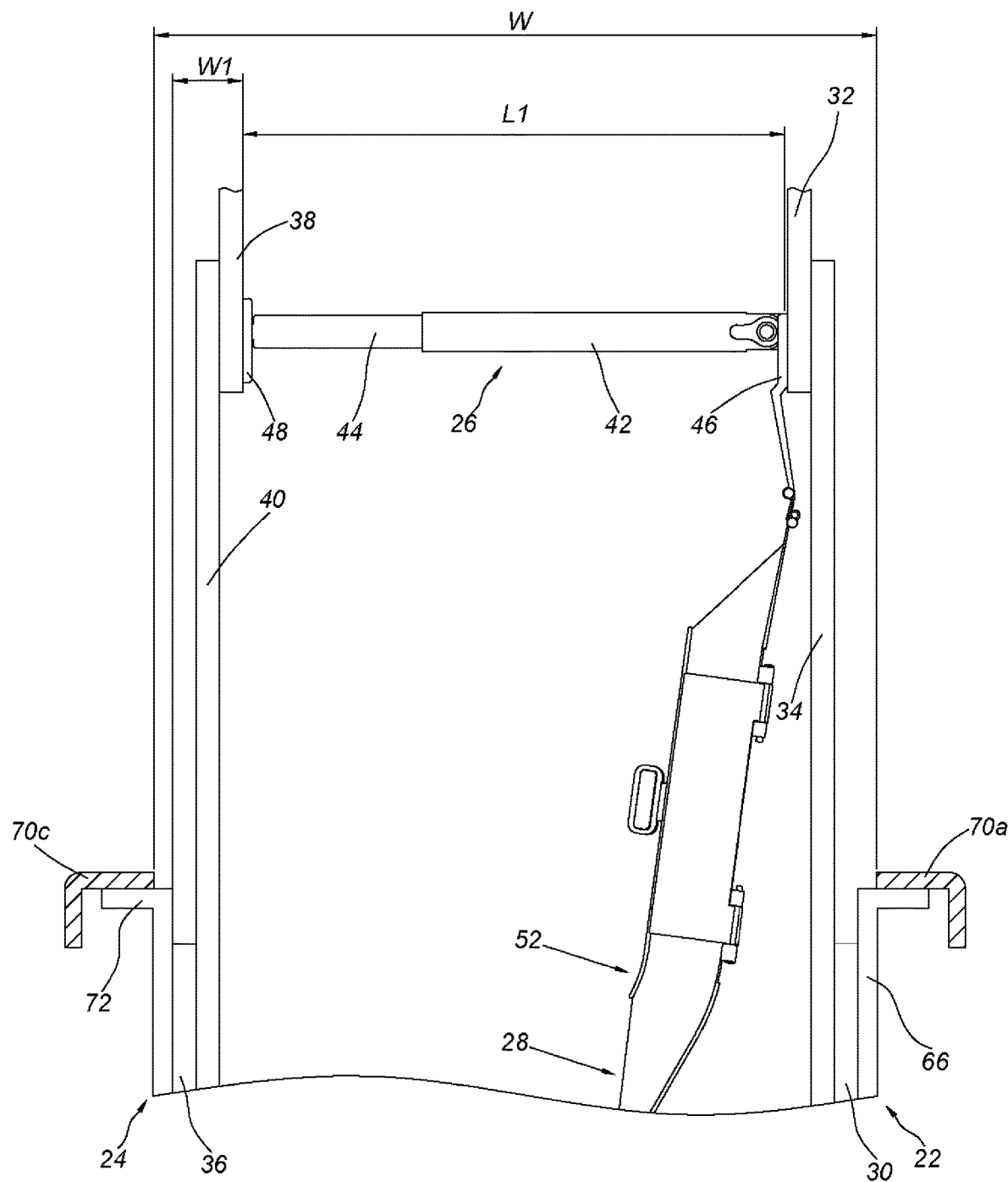
FIG. 5 is a schematic diagram illustrating the support assembly implemented on the rack system, and a cable management device of the support assembly being adjusted to a first length according to the first embodiment of the present invention.

As shown in FIG. 5, a rack width W between the two sides of a rack in a rack system (such as the rack width W between the first post 70a and the third post 70c) typically has a predetermined specification. In order to accommodate the aforementioned carried object 76 with a first type of width, it is sometimes necessary to use a slide rail assembly (such as the first slide rail assembly 22 or the second slide rail assembly 24) with a first width W1 to accommodate said width of the carried object 76. Here, the second cross bar 44 of the first cable management device 26 with an adjustable (via extension or retraction relative to the first cross bar 42) first length L1 can be configured to adapt to or accommodate the slide rail assembly with the first width W1.

Figure 6:
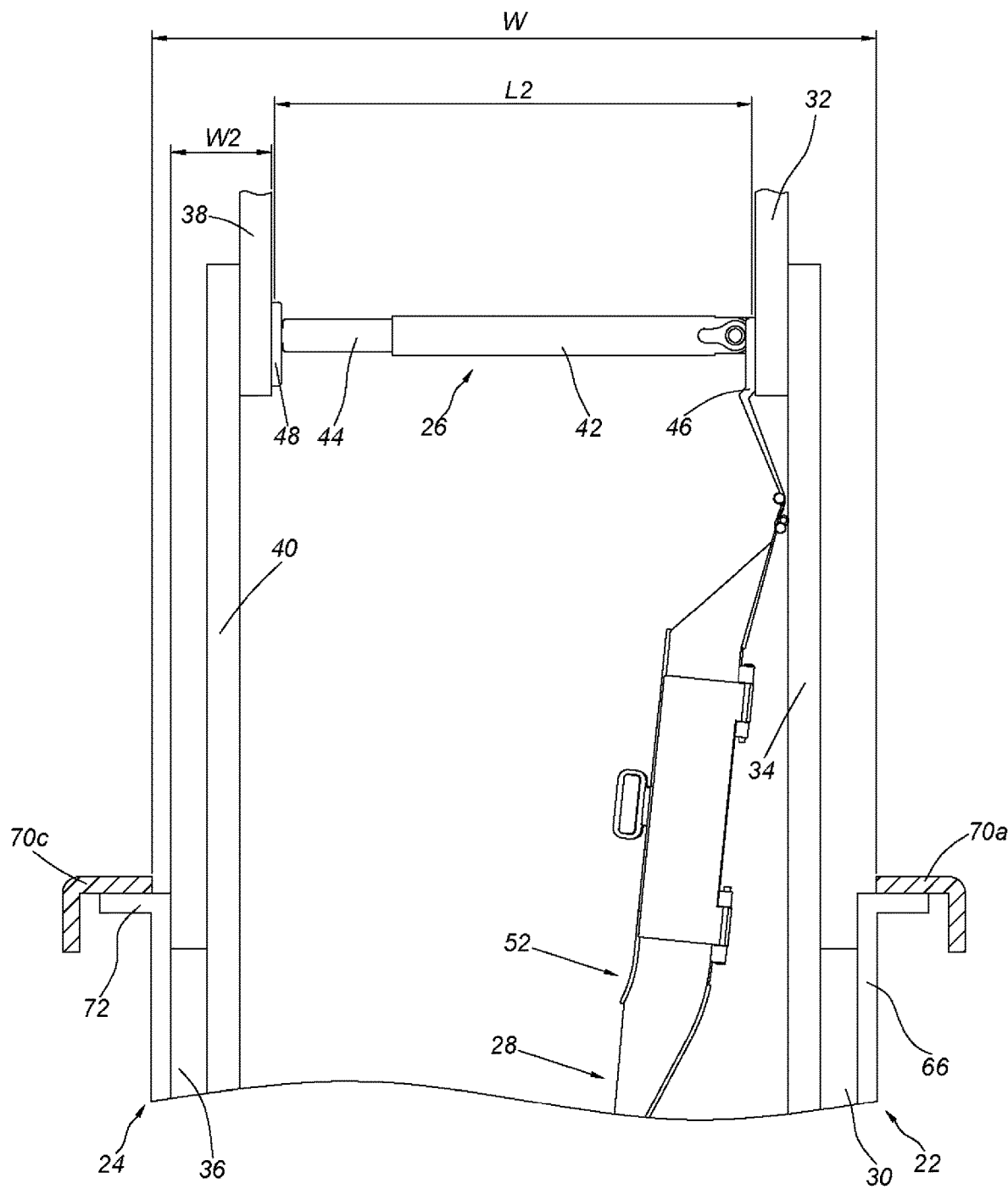
FIG. 6 is a schematic diagram illustrating the support assembly implemented on the rack system, and the cable management device of the support assembly being adjusted to a second length according to the first embodiment of the present invention.

As shown in FIG. 6, sometimes the carried object 76 can have a second width under different requirements. Therefore, a slide rail assembly (such as the first slide rail assembly 22 or the second slide rail assembly 24) with a second width W2 (different from the aforementioned first width W1) is needed to accommodate the said second width of the carried object 76. Here, the second cross bar 44 of the first cable management device 26 with an adjustable (via extension or retraction relative to the first cross bar 42) second length L2 that is different from the aforementioned first length L1 can be configured to adapt to or accommodate the slide rail assembly with the second width W2.

Figure 7:
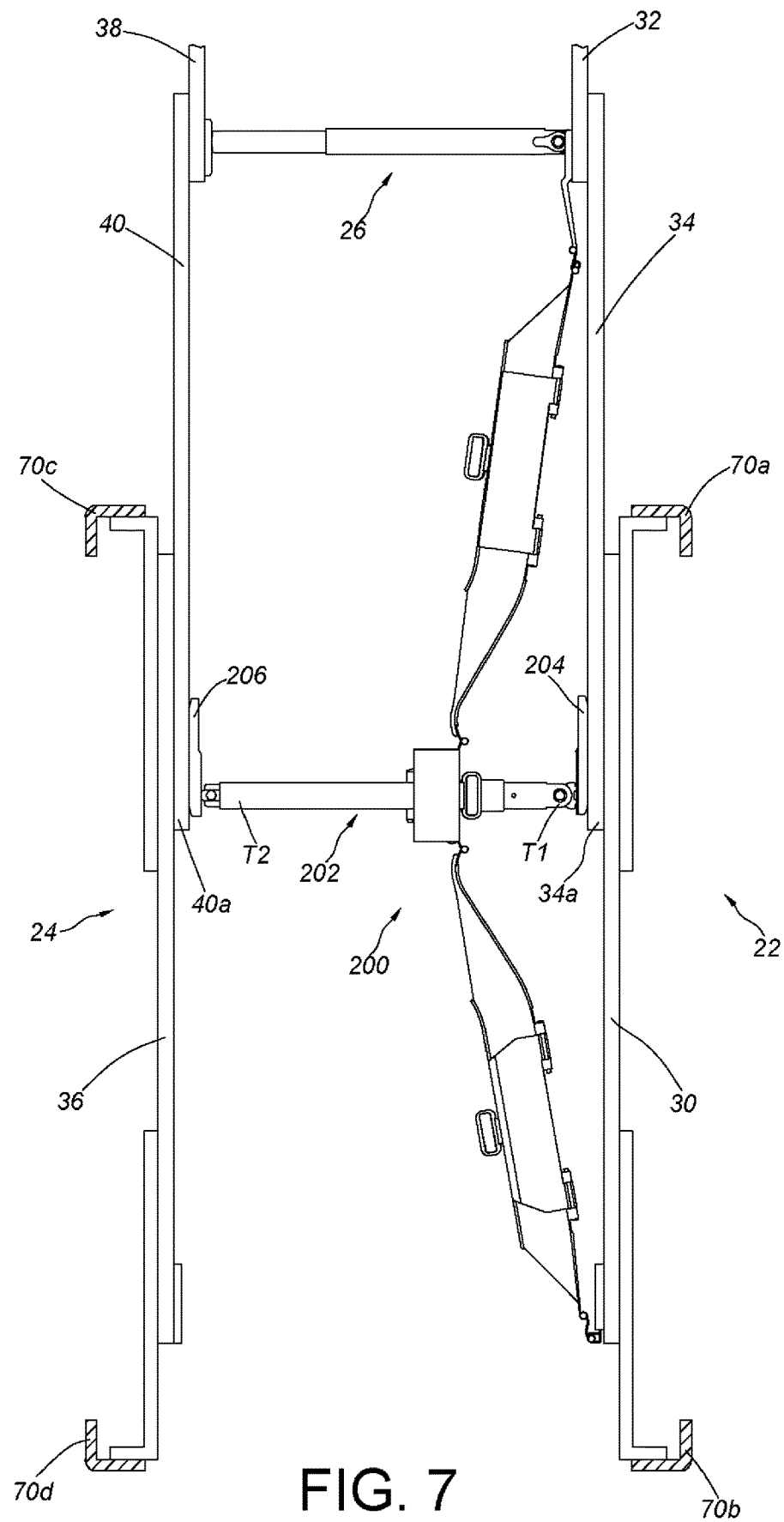
FIG. 7 is a schematic diagram illustrating the support assembly implemented on the rack system according to a second embodiment of the present invention.

FIG. 7 shows a support assembly according to the second embodiment of the present invention. The substantial difference between the support assembly of the second embodiment and the support assembly 20 of the first embodiment is the following: a first end T1 of at least one support bar 202 of a second cable management device 200 of the second embodiment is detachably mounted to the rear end 34a of the first middle rail 34 that is close to the first slide rail assembly 22 through a first mounting member 204 by insertion, snapping or latching; on the other hand, a second end T2 of at least one support bar 202 is detachably mounted to the rear end 40a of the second middle rail 40 that is close to the second slide rail assembly 24 through a second mounting member 206 by insertion, snapping or latching. Such arrangement allows the at least one support bar 202 to move along with the first middle rail 34 and the second middle rail 40.

Figure 8:
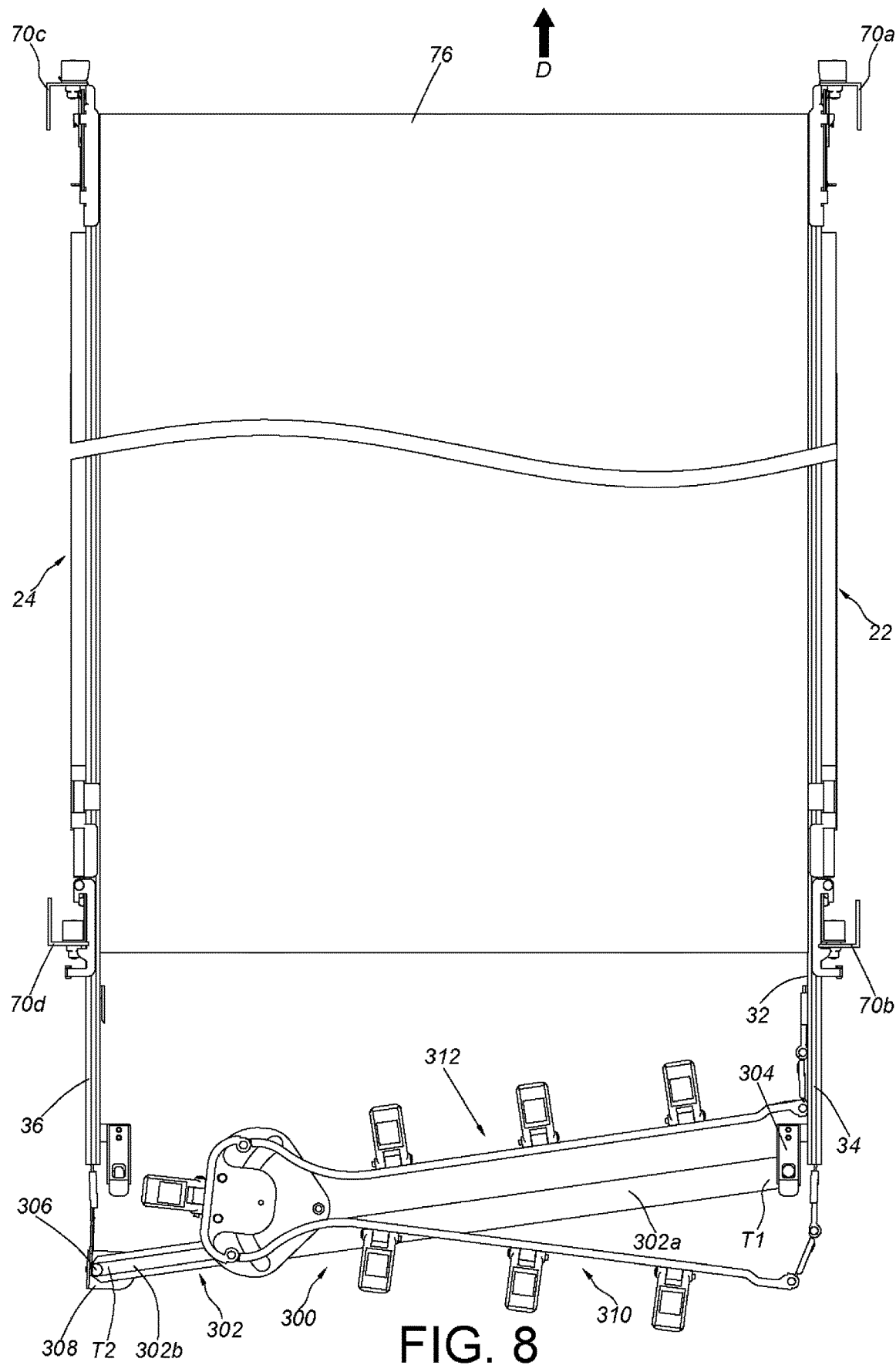
FIG. 8 is a schematic diagram illustrating the support assembly implemented on the rack system, and another cable management device of the support assembly being at a first status according to a third embodiment of the present invention.
Figure 9:
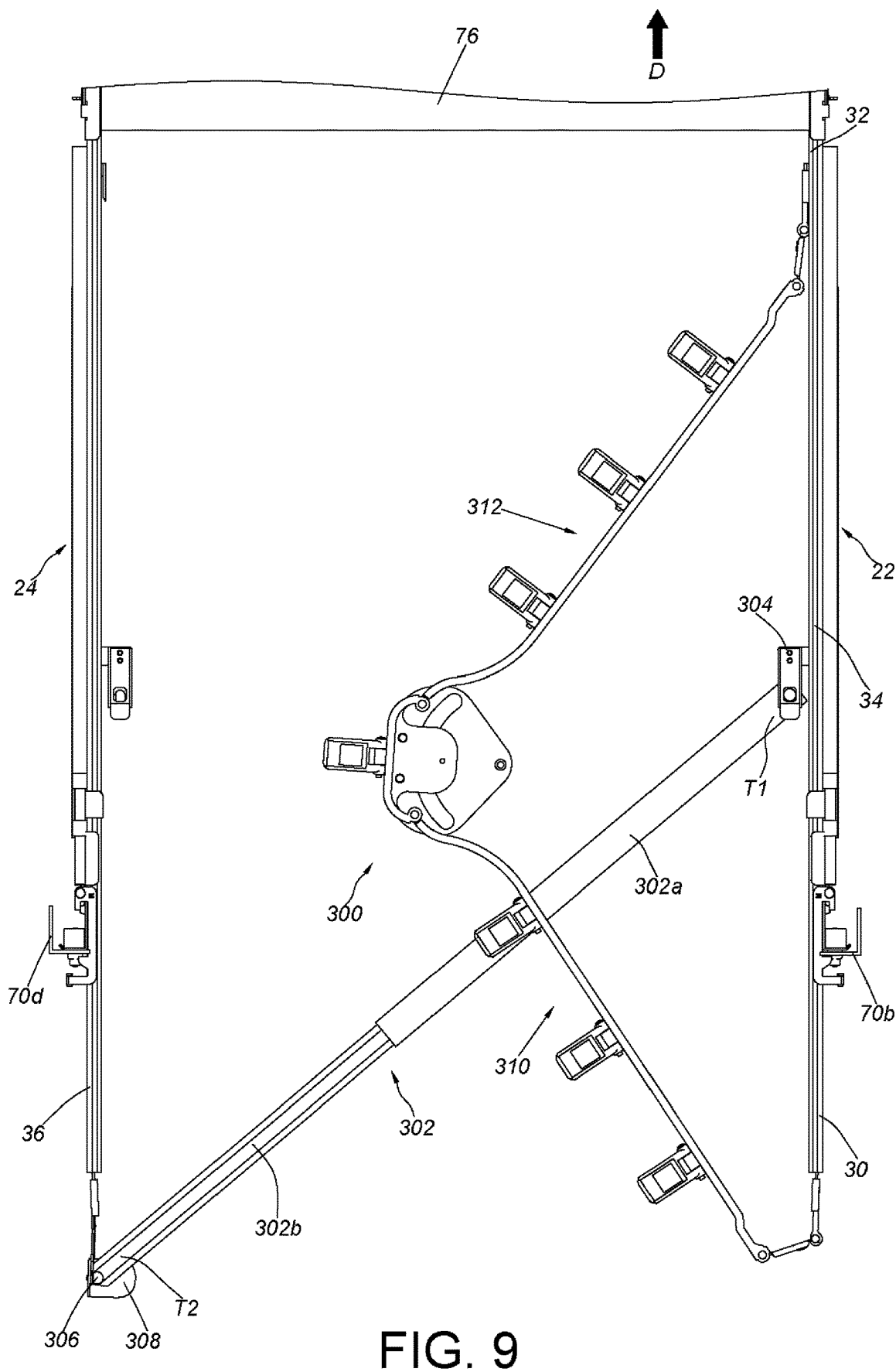
FIG. 9 is a schematic diagram illustrating the support assembly implemented on the rack system, and the another cable management device of the support assembly being at a second status according to a third embodiment of the present invention.

FIGS. 8 and 9 show a support assembly according to the third embodiment of the present invention. The substantial difference between the support assembly of the third embodiment and the support assembly 20 of the first embodiment is the following: a first end T1 of a first support bar 302a of at least one support bar 302 of a second cable management device 300 of the third embodiment is detachably mounted to the rear end of the first middle rail 34 that is close to the first slide rail assembly 22 through a first mounting member 304 by insertion, snapping or latching; on the other hand, a second end T2 of a second support bar 302b of at least one support bar 302 is mounted to the rear end of the third rail 36 (fixed rail) that is close to the second slide rail assembly 24 through a second mounting member 306. Preferably, the second end T2 is pivotally connected to a mounting base 308 of a rear end of the third rail 36. In such arrangement, a second support bar 302b can pivot and swing when the first middle rail 34 moves in the opening direction D relative to the first rail 30, and a first support bar 302a can change from a retracted status into an extended status relative to the second support bar 302b, so as to accommodate the extension of a first cable management arm 310 relative to a second cable management arm 312. It is worth noting that the aforementioned first cable management device 26 is not illustrated in the third embodiment shown in FIGS. 8 and 9.

It can be seen from the aforementioned embodiments according to the present invention that the support assembly herein includes the following advantages:

1. The first cable management device 26 is mounted to the second rail 32 of the first slide rail assembly 22 and the fourth rail 38 of the second slide rail assembly 24, and the second cable management device 28 comprises the first cable management arm 50 and the second cable management arm 52. The first cable management arm 50 is mounted to the first rail 30 of the first slide rail assembly 22, and the second cable management arm 52 is mounted to the second rail 32 of the first slide rail assembly 22.

2. The first cable management device 26 and the second cable management device 28 are two independent cable supporting devices configured to support the different sections of cables (such as the front cable section 78a and the rear cable section 78b) behind the carried object 76.

3. The length of the first cable management device 26 can be adjusted to accommodate slide rail assemblies with varying widths.

4. The second cable management device 28 comprises at least one support bar, the at least one support bar is configured to support one of the first cable management arm 50 and the second cable management arm 52.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A support assembly for supporting a cable and adapted to a rack system, the support assembly comprising:
   a first slide rail assembly mounted to a first side of the rack system, the first slide rail assembly comprising a first rail, a second rail movable relative to the first rail and a first middle rail movably connecting the first rail and the second rail, so as to extend a movement range of the second rail relative to the first rail;
   a second slide rail assembly mounted to a second side of the rack system, the second slide rail assembly comprising a third rail, a fourth rail movable relative to the third rail and a second middle rail moveably connecting the third rail and the fourth rail, so as to extend a movement range of the fourth rail relative to the third rail;
   a carried object mounted between the first slide rail assembly and the second slide rail assembly;
   a first cable management device with two ends respectively mounted to the first slide rail assembly and the second slide rail assembly, the first cable management device comprises a first cross bar and a second cross bar movably connected to the first cross bar, the first cross bar is detachably mounted to the rear end of the second rail that is close to the first slide rail assembly through a first connecting member, and the second cross bar is detachably mounted to the rear end of the fourth rail that is close to the second slide rail assembly through a second connecting member; and
   a second cable management device comprising a first cable management arm and a second cable management arm, one end of the first cable management arm being pivotally connected to one end of the second cable management arm, another end of the first cable management arm being detachably mounted to the first rail of the first slide rail assembly, and another end of the second cable management arm being detachably mounted to the second rail of the first slide rail assembly, the second cable management device further comprising at least one support bar, the at least one support bar being configured to support one of the first cable management arm and the second cable management arm, the at least one support bar having two ends respectively mounted to the first slide rail assembly and the second slide rail assembly;
   wherein the first cable management device is between the carried object and the second cable management device, the first cable management device is configured to arrange a front cable section of the carried object;
   wherein the second cable management device is configured to arrange a rear cable section of the carried object.

2. The support assembly of claim 1, wherein the carried object is in front of the first cable management device, and the second cable management device is behind the first cable management device.

3. The support assembly of claim 1, wherein the at least one support bar further comprises a first support bar and a second support bar movably connected to the to the first support bar.

* * * * *